US012602088B2

(12) United States Patent　　(10) Patent No.: US 12,602,088 B2

Kuo et al.　　(45) Date of Patent: Apr. 14, 2026

(54) ELECTRONIC DEVICE WITH ELECTROSTATIC PROTECTION DEVICE

(71) Applicant: Quanta Computer Inc., Taoyuan City (TW)

(72) Inventors: Chao Hung Kuo, Taoyuan City (TW); Ping-Feng Lee, Taoyuan City (TW); Wen-Cheng Lin, Taoyuan City (TW)

(73) Assignee: QUANTA COMPUTER INC., Taoyuan City (TW)

( * ) Notice: Subject to any disclaimer, the term of this patent is extended or adjusted under 35 U.S.C. 154(b) by 126 days.

(21) Appl. No.: 18/619,683

(22) Filed: Mar. 28, 2024

(65) Prior Publication Data

US 2025/0224774 A1　Jul. 10, 2025

(30) Foreign Application Priority Data

Jan. 4, 2024　(TW) ................................. 113100334

(51) Int. Cl.
*G06F 1/16* (2006.01)
*G06F 1/20* (2006.01)
*H05K 7/20* (2006.01)

(52) U.S. Cl.
CPC ............ *G06F 1/1658* (2013.01); *G06F 1/203* (2013.01); *H05K 7/20145* (2013.01)

(58) Field of Classification Search
CPC ...... G06F 1/1658; G06F 1/203; G06F 1/1656; G06F 1/182; H05K 7/20145; H05K 9/0067
See application file for complete search history.

(56) References Cited

U.S. PATENT DOCUMENTS

| | | | | |
|---|---|---|---|---|
| 8,154,884 B2 * | 4/2012 | Lin | ...................... | H05K 1/0215 |
| | | | | 361/818 |
| 8,780,004 B1 * | 7/2014 | Chin | ...................... | H01Q 1/526 |
| | | | | 361/818 |
| 9,370,132 B2 * | 6/2016 | Coppola | .............. | H05K 9/0041 |
| 2008/0158851 A1 * | 7/2008 | Cochrane | ............. | H05K 9/0073 |
| | | | | 361/818 |
| 2011/0304972 A1 * | 12/2011 | Goh | .......................... | G06F 1/16 |
| | | | | 361/679.33 |
| 2014/0321046 A1 * | 10/2014 | Sinha | ........................ | G06F 1/20 |
| | | | | 361/679.33 |

(Continued)

FOREIGN PATENT DOCUMENTS

TW　　　　201907778 A　　2/2019

OTHER PUBLICATIONS

Chinese language office action dated Aug. 16, 2024, issued in application No. TW 113100334.

*Primary Examiner* — Allen L Parker
*Assistant Examiner* — Keon Kim
(74) *Attorney, Agent, or Firm* — McClure, Qualey & Rodack, LLP

(57) ABSTRACT

An electronic device includes a base, a covering body, a metal member and a protection device. The covering body is made of conductive material and is fixedly connected to the base. The metal member is fixedly disposed on the base. The protection device is disposed on the base and connected between the metal member and the covering body. The covering body and the base are arranged along a first axis, and when viewed along the first axis, the protection device overlaps at least a portion of the metal member.

14 Claims, 8 Drawing Sheets

(56) References Cited

U.S. PATENT DOCUMENTS

2016/0165765 A1* 6/2016 Yamada ............. B60R 16/0215
174/350
2022/0132701 A1* 4/2022 Lee ...................... H05K 5/0217
2024/0413517 A1* 12/2024 Li .......................... H01Q 1/526

* cited by examiner

100

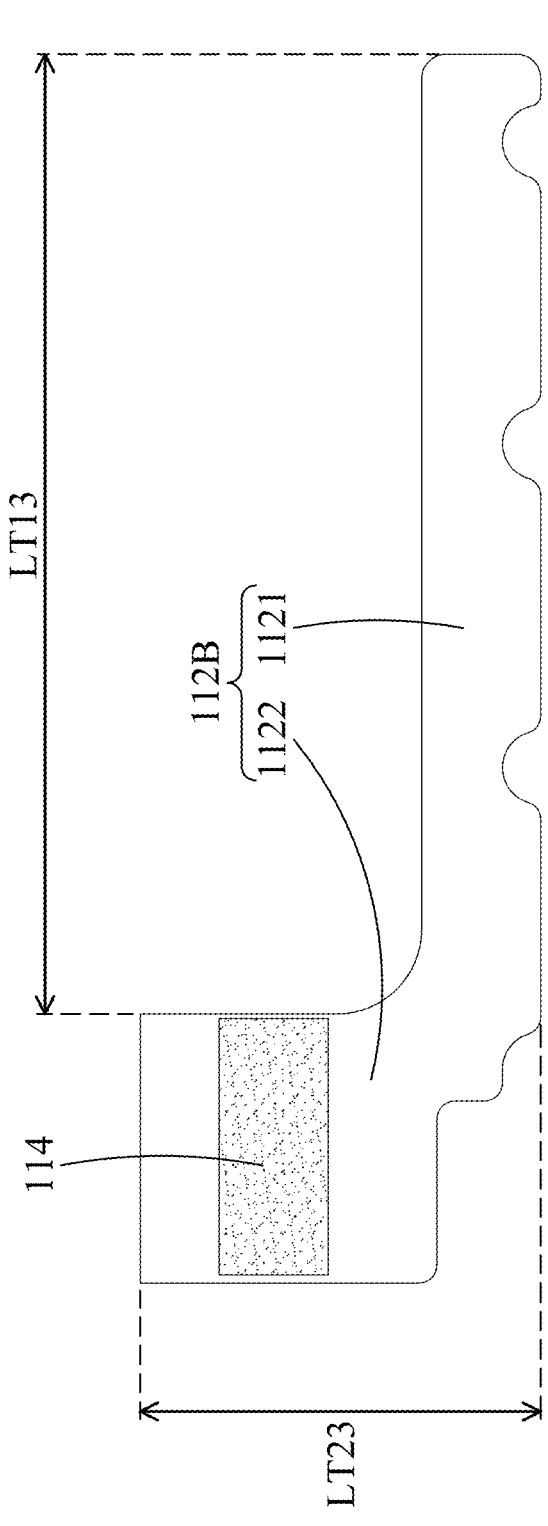
FIG. 6
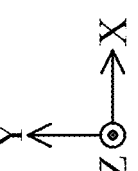

ELECTRONIC DEVICE WITH ELECTROSTATIC PROTECTION DEVICE

CROSS REFERENCE TO RELATED APPLICATIONS

This application claims the benefit of Taiwan Patent Application No. 113100334, filed on Jan. 4, 2024, the entirety of which is incorporated by reference herein.

BACKGROUND OF THE INVENTION

Field of the Disclosure

The present disclosure relates to an electronic device, and in particular it relates to an electronic device with an electrostatic protection function.

Description of the Related Art

As technology has developed, many electronic devices (such as notebook computers and handheld game consoles) are now quite common, and are very popular products.

Generally speaking, the casing of an electronic device can be composed of plastic and metal components. However, the metal part of a casing may be a separate piece (such as a metal plate in a plastic base), so that the static charge on this metal part may move to another metal part within the casing or to another electronic component, causing a secondary discharge. The secondary discharge may cause a strong electromagnetic field, which affects the normal operation of the electronic components in the electronic device.

Therefore, how to design an electronic device capable of avoiding secondary discharge is a topic that needs to be discussed and solved.

BRIEF SUMMARY OF THE INVENTION

One objective of the present disclosure is to provide an electronic device to solve the problem described above.

According to some embodiments of the disclosure, an electronic device is provided. The electronic device includes a base, a covering body, a metal member and a protection device. The covering body is made of conductive material and is fixedly connected to the base. The metal member is fixedly disposed on the base. The protection device is disposed on the base and connected between the metal member and the covering body. The covering body and the base are arranged along a first axis, and when viewed along the first axis, the protection device overlaps at least a portion of the metal member.

According to some embodiments, the protection device further includes a first conductive member and a second conductive member, the second conductive member is disposed on the first conductive member, the first conductive member is configured to be in contact with a portion of the metal member, and the second conductive member is configure to be in contact with a portion of the covering body.

According to some embodiments, the first conductive member has a first section and a second section, the second section is connected to the first section, the first section extends along a second axis, the second section extends along a third axis, and the first axis, the second axis and the third axis are perpendicular to each other.

According to some embodiments, the metal member has at least one opening, the base is made of a plastic material, and a portion of the base corresponding to the at least one opening is processed by hot melting so as to affix the metal member to the base.

According to some embodiments, the first section has at least one notch, corresponding to the at least one opening.

According to some embodiments, an insulation layer is formed on a surface of the metal member, and the metal member further has a contact portion configured to contact the first section of the first conductive member.

According to some embodiments, there is no insulation layer provided on the contact portion.

According to some embodiments, the metal member has a rectangular structure, and the first section is in contact with a first side of the rectangular structure.

According to some embodiments, the metal member has a rectangular structure, and the first section and the second section are respectively in contact with a first side and a second side of the rectangular structure.

According to some embodiments, the length of the second section is 4 to 8 cm, and the distance between the second conductive member and the metal member along the third axis is 5 to 7 cm.

According to some embodiments, the second section has a perforation, and a positioning column is disposed on the base, and when the protection device is affixed to the base, the positioning column passes through the perforation.

According to some embodiments, the metal member has a rectangular structure, the first conductive member has a frame-shaped structure corresponding to the rectangular structure, and the frame-shaped structure is in contact with four sides of the rectangular structure.

According to some embodiments, the positioning column is made of a plastic material.

According to some embodiments, the electronic device further includes a motherboard, and when viewed along the first axis, the protection device does not overlap the motherboard.

According to some embodiments, a plurality of air vents are formed on the base, and a plurality of perforations are formed on the metal member corresponding to the air vents, so that heat generated by the electronic device is dissipated to the external environment through the perforations and the air vents.

According to some embodiments, the protection device further includes a first conductive member and a second conductive member, and the second conductive member is disposed on the first conductive member. The first conductive member is flexible, and the first conductive member is made of a metal material.

According to some embodiments, the first conductive member is a conductive cloth, and the second conductive member is a gasket.

The present disclosure provides an electronic device, which includes a base, a covering body, a metal member and a protection device. The covering body has conductive material and is fixedly connected to the base. The metal member is fixedly disposed on base. The protection device is disposed on the base and connected between the metal member and the covering body. The covering body and the base are arranged along the first axis, and the protection device overlaps at least a portion of the metal member when viewed along the first axis.

The protection device may include a first conductive member and a second conductive member. The second conductive member is fixedly disposed on the first conductive member. The first conductive member is configured to contact a part of the metal member, and the second conductive member is configured to contact a part of the covering body. Based on this configuration, when electrostatic charges are generated on the metal member, the electrostatic charges can be conducted to the first section of the first conductive member through the contact portion of the metal member, and then conducted through the second section of the first conductive member and the second conductive member in sequence to the grounding terminal on the covering body. Therefore, the protection device can effectively conduct the electrostatic charges to the ground to protect the electronic components in the electronic device from being damaged by the electrostatic charges.

In some embodiments, the first conductive member has an L-shaped structure, but it is not limited thereto. In other embodiments, the first conductive member may have a frame-shaped structure. In addition, the first conductive member is flexible, thus increasing the convenience of being installed on the base. In addition, because it can be bent or folded, electronic devices of different sizes can use a single size protection device, thus further reducing the production costs.

Additional features and advantages of the disclosure will be set forth in the description which follows, and, in part, will be obvious from the description, or can be learned by practice of the principles disclosed herein. The features and advantages of the disclosure can be realized and obtained by means of the instruments and combinations pointed out in the appended claims. These and other features of the disclosure will become more fully apparent from the following description and appended claims, or can be learned by the practice of the principles set forth herein.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a schematic diagram of a protection device 110B according to another embodiment of the present disclosure.

DETAILED DESCRIPTION OF THE INVENTION

Figure 1:
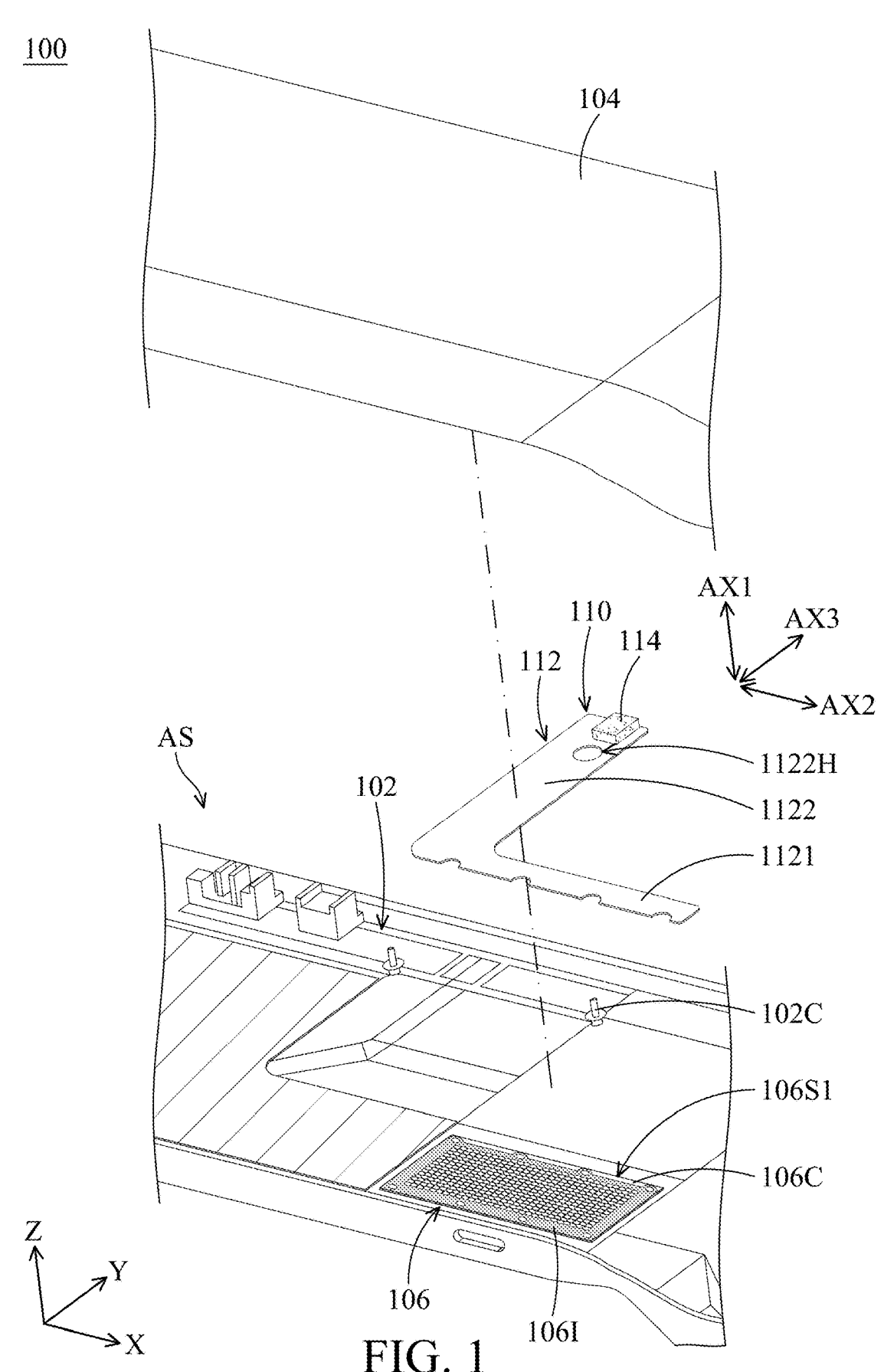
FIG. 1 is an exploded schematic diagram of an electronic device 100 according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are in direct contact, and may also include embodiments in which additional features may be disposed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are in direct contact, and may also include embodiments in which additional features may be disposed interposing the features, such that the features may not be in direct contact. In addition, spatially relative terms, for example, "vertical," "above," "over," "below,", "bottom," etc. as well as derivatives thereof (e.g., "downwardly," "upwardly," etc.) are used in the present disclosure for ease of description of one feature's relationship to another feature. The spatially relative terms are intended to cover different orientations of the device, including the features.

Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

In addition, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

Figure 2:
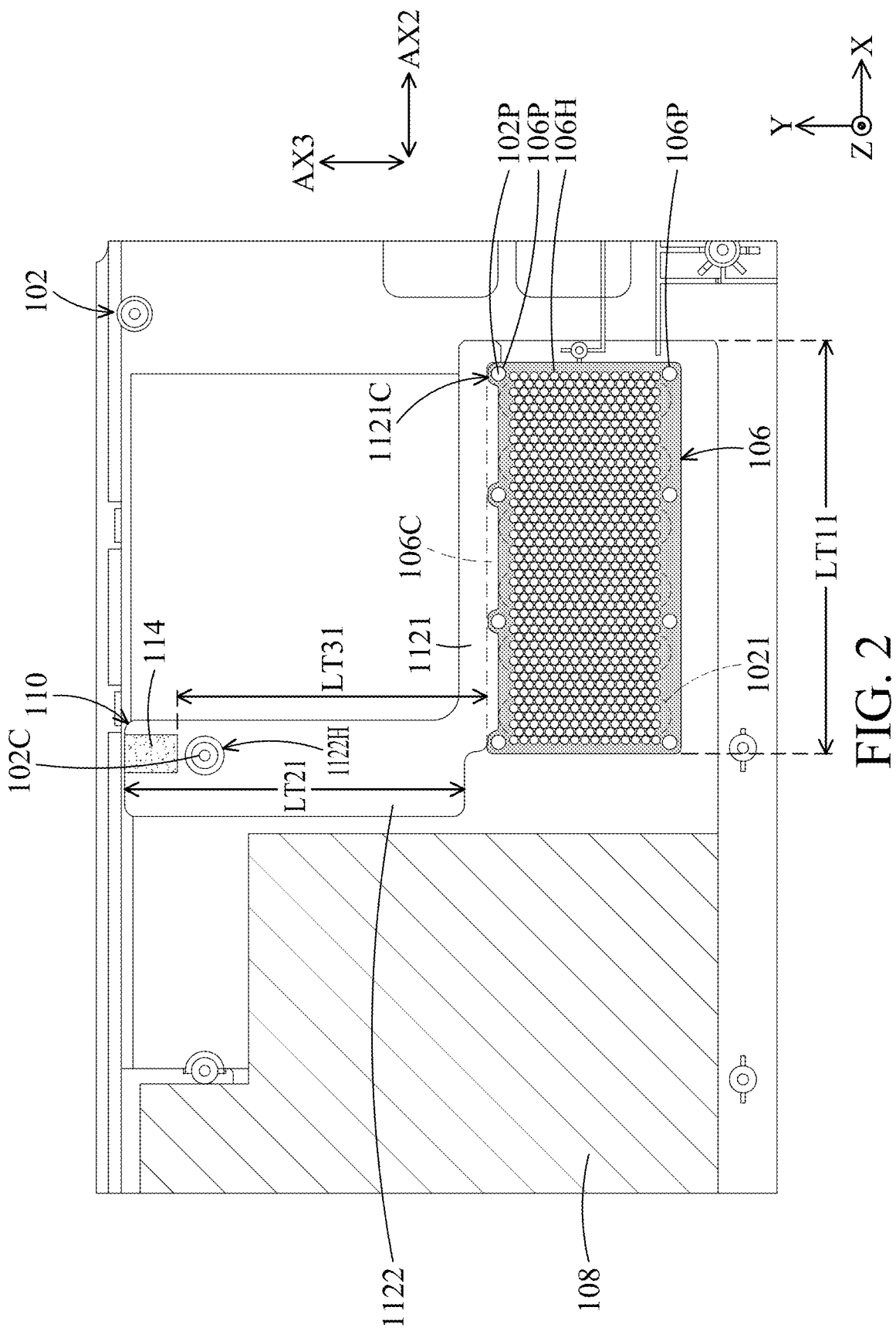
FIG. 2 is a top view of a partial structure of the electronic device 100 according to an embodiment of the present disclosure.

Please refer to FIG. 1 and FIG. 2. FIG. 1 is an exploded schematic diagram of an electronic device 100 according to an embodiment of the present disclosure, and FIG. 2 is a top view of a partial structure of the electronic device 100 according to an embodiment of the present disclosure. The electronic device 100 is, for example, a laptop computer or a handheld game console, but it is not limited thereto. In this embodiment, the electronic device 100 may include a base 102, a covering body 104, a metal member 106 and a protection device 110.

The covering body 104 and the base 102 are arranged along a first axis AX1, and the covering body 104 is fixedly connected to the base 102 so as to form an accommodation space AS of the electronic device 100. The accommodation space AS is configured to accommodate a circuit board 108 and other electronic components, such as a touch panel, a keyboard (not shown in the figures), and so on. In this embodiment, the covering body 104 can be made of a metal material, and the base 102 can be made of a plastic material, but they are not limited thereto.

The metal member 106 is, for example, a metal sheet, which is fixedly disposed on the base 102 and has a plurality of openings 106P. A portion of the base 102 corresponding to the openings 106P can be processed by hot melting so as to affix the metal member 106 to the base 102. For example, a plurality of positioning columns 102P may be formed on the base 102 and respectively pass through the plurality of openings 106P in the metal member 106, and the plastic positioning columns 102P can affix the metal member 106 to the base 102 through the hot melting or heat riveting process. The connection method between the metal member 106 and the base 102 is not limited to this. For example, they can also be connected to each other through glue.

As shown in FIG. 2, a plurality of air vents 1021 are formed on the base 102, and the metal member 106 is configured to correspond to the plurality of air vents 1021. A plurality of perforations 106H may be formed on the metal member 106 corresponding to the air vents 1021. The heat generated by the electronic device 100 can be dissipated to the external environment by the wind (the air) which is driven by the fan to pass through the perforations 106H and the air vents 1021.

In order to prevent the secondary discharge generated by the electrostatic charges on the metal member 106 from causing damage to the electronic components on the circuit board 108, the electronic device 100 may further include a protection device 110 which is disposed on the base 102 and connected between the metal member 106 and the covering body 102. As shown in FIG. 2, when viewed along the first axis AX1 (the Z-axis), the protection device 110 overlaps at least a portion of the metal member 106.

In this embodiment, the protection device 110 includes a first conductive member 112 and a second conductive member 114, and the second conductive member 114 is disposed on the first conductive member 112. For example, the first conductive member 112 is fixedly connected to the base 102 by using glue, and the second conductive member 114 is fixedly connected to the first conductive member 112 by using glue, but the connection method is not limited thereto. Furthermore, the first conductive member 112 is configured to contact a portion of the metal member 106, and the second conductive member 114 is configured to contact a portion of the covering body 104.

As shown in FIG. 1 and FIG. 2, the first conductive member 112 has a first section 1121 and a second section 1122, and the second section 1122 is connected to the first section 1121. The first section 1121 extends along a second axis AX2, and the second section 1122 extends along a third axis AX3. The first axis AX1, the second axis AX2 and the third axis AX3 are perpendicular to each other.

In addition, as shown in FIG. 1 and FIG. 2, the metal member 106 has a rectangular structure, and the first section 1121 is in contact with a first side 106S1 of the rectangular structure. Furthermore, the first section 1121 may have at least one notch 1121C, corresponding to at least one opening 106P. As shown in FIG. 2, the first section 1121 has four notches 1121C, which respectively correspond to the four openings 106P. When viewed along first axis AX1, the first section 1121 does not overlap openings 106P.

Based on the design of notches 1121C, the first conductive member 112 can be accurately installed on the base 102, and the positioning columns 102P can assist the operator in positioning when installing the first conductive member 112.

In this embodiment, an insulation layer 1061 is formed on the surface of the metal member 106, and the metal member 106 further has a contact portion 106C configured to contact the first section 1121 of the first conductive member 112. It is worth noting that the insulation layer 1061 is not provided on the contact portion 106C.

Therefore, the electrostatic charges on the metal member 106 can be conducted to the first section 1121 via the contact portion 106C, and then transmitted through the second section 1122 and the second conductive member 114, and finally conducted to the grounding terminal on the covering body 104. That is, the protection device 110 can effectively conduct the electrostatic charges to the grounding terminal so as to protect the electronic components in the electronic device 100.

In addition, in this embodiment, the second section 1122 has a perforation 1122H, a positioning column 102C is disposed on the base 102, and when the protection device 110 is affixed to the base 102, the positioning column 102C passes through the perforation 1122H to assist the protection device 110 in positioning. In this embodiment, the positioning column 102C can be made of a plastic material, but it is not limited thereto.

In this embodiment, the first conductive member 112 is flexible, thereby increasing the convenience of being installed on the base 102. In this embodiment, the first conductive member 112 can be made of a metal material, such as a conductive cloth, but it is not limited thereto. The second conductive member 114 is, for example, conductive foam (a gasket), but it is not limited thereto.

In addition, it should be noted that, as shown in FIG. 2, when viewed along the first axis AX1, the protection device 110 does not overlap the motherboard 108. Based on such a configuration, electrostatic charges can be prevented from being transmitted to the motherboard 108 and causing damage to the electronic components.

Figure 3:
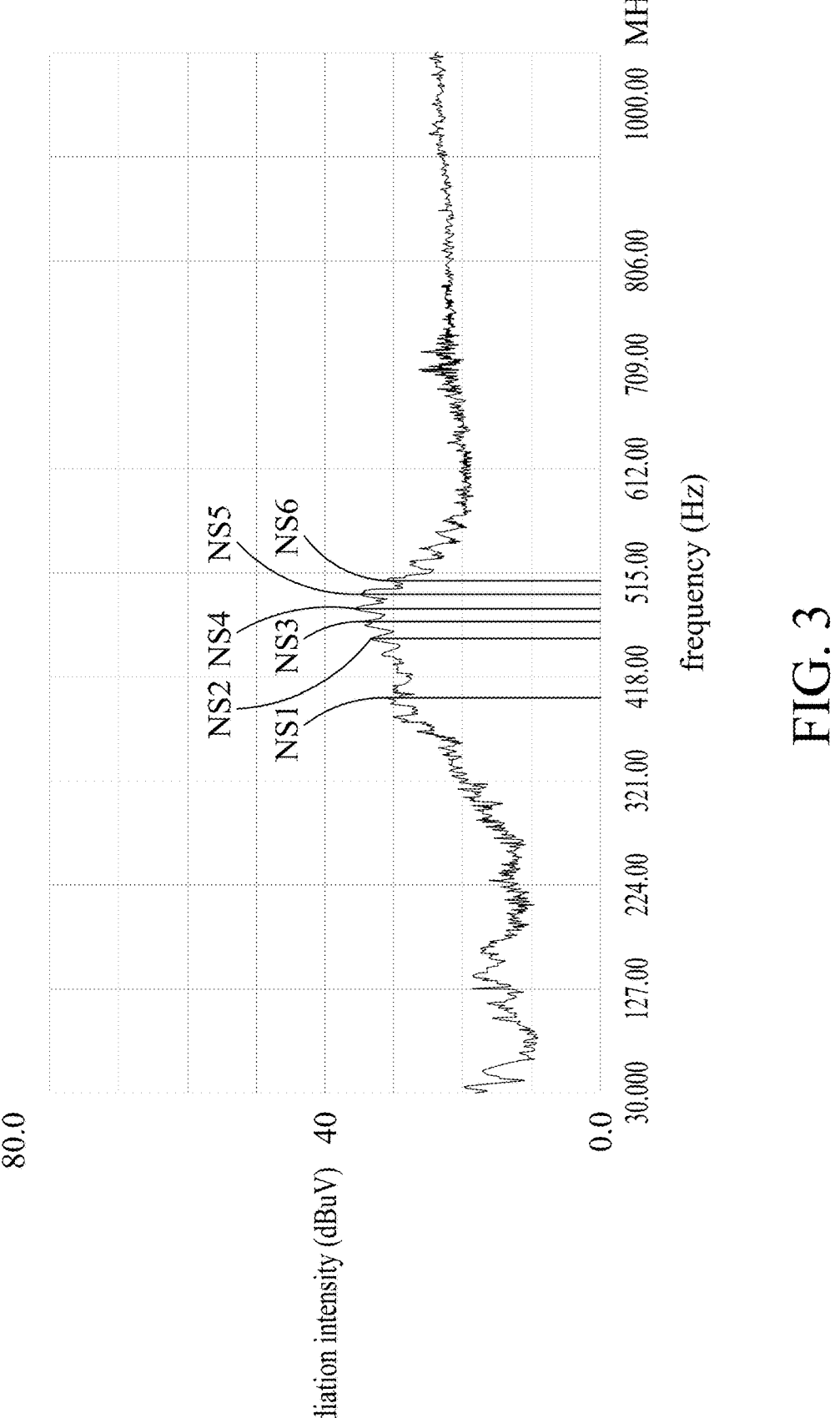
FIG. 3 is a waveform diagram of the frequency and radiation intensity of a conventional electronic device without the protection device 110.
Figure 4:
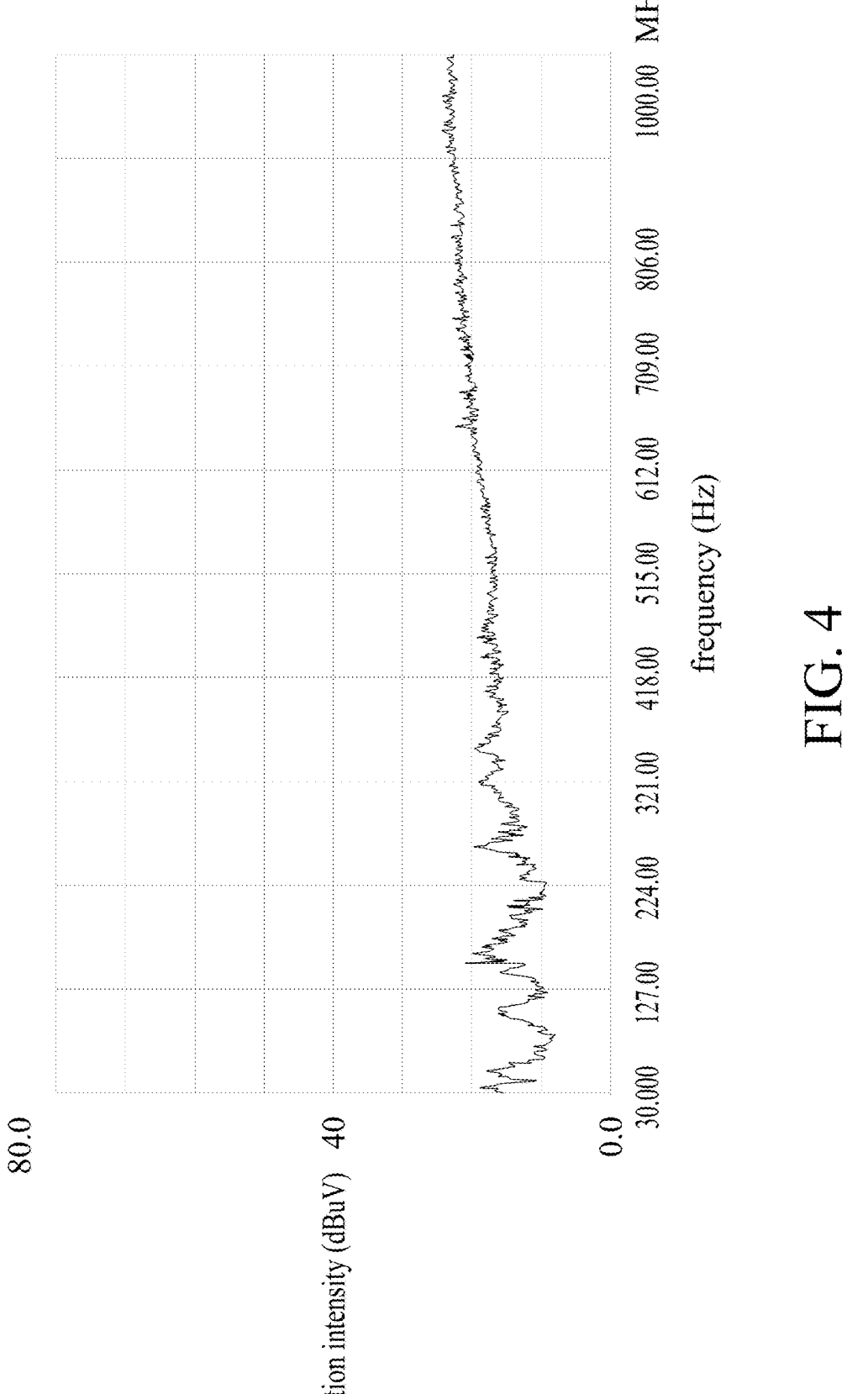
FIG. 4 is a waveform diagram of the frequency and radiation intensity of the electronic device 100 with the protection device 110 according to an embodiment of the present disclosure.

Next, please refer to FIG. 1 to FIG. 4. FIG. 3 is a waveform diagram of the frequency and radiation intensity of a conventional electronic device without the protection device 110, and FIG. 4 is a waveform diagram of the frequency and radiation intensity of the electronic device 100 with the protection device 110 according to an embodiment of the present disclosure. In this embodiment, after adding the protection device 110, the electromagnetic interference (EMI) of the electronic device 100 can be reduced.

As shown in FIG. 3, before the protection device 110 is added, the conventional electronic device has obvious noises (such as the noise NS1 to the noise NS6) between the frequency of 400 Hz and 500 Hz, thereby affecting the normal operation of the electronic components or chips in the conventional electronic device.

As shown in FIG. 4, after adding the protection device 110, the noise of the electronic device 100 between the frequency of 400 Hz and 500 Hz is significantly reduced, thus ensuring the normal operation of the electronic components or chips in the electronic device 100.

It should be noted that, as shown in FIG. 2, the length LT21 of the second section 1122 can be 4 to 8 cm, and the distance LT31 between the second conductive member 114 and the metal member 106 along the third axis AX3 can be 5 to 7 cm. The distance LT31 may be one tenth, one fifth or one quarter of the wavelength corresponding to 500 Hz. Based on this length design, it can not only avoid problems caused by the electrostatic charges, but also effectively reduce electromagnetic interference.

Figure 5:
FIG. 5 is a schematic diagram of a protection device 110A according to another embodiment of the present disclosure.
Figure 5:
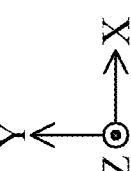
Figure 5:
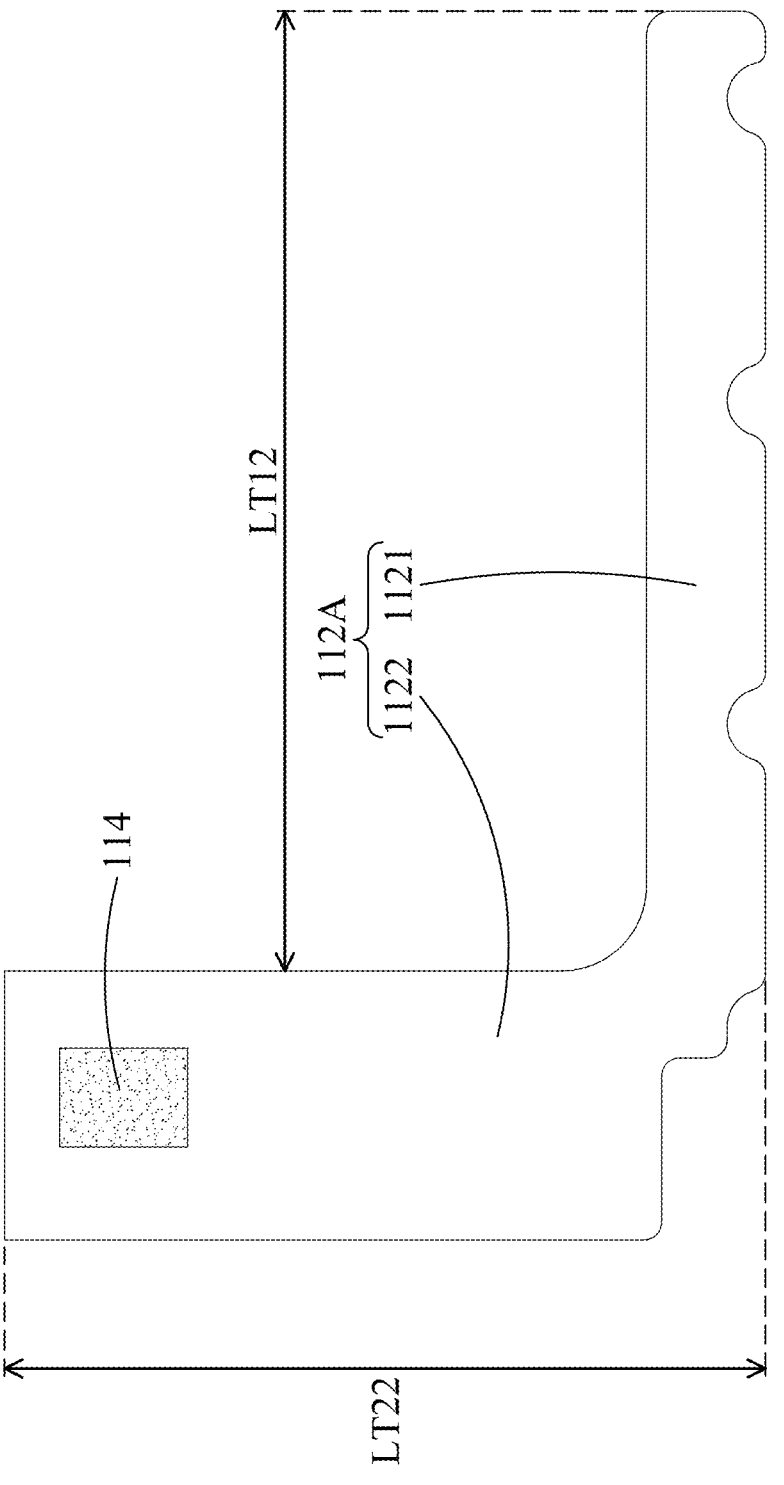

Next, please refer to FIG. 5 to FIG. 6. FIG. 5 is a schematic diagram of a protection device 110A according to another embodiment of the present disclosure, and FIG. 6 is a schematic diagram of a protection device 110B according to another embodiment of the present disclosure. The size of the protection device can be adjusted according to actual needs. For example, the protection device 110A corresponds to a 14-inch notebook computer, and the protection device 110B corresponds to a 15-inch notebook computer.

Specifically, as shown in FIG. 2 and FIG. 5, the length LT12 of the first section 1121 of the first conductive member 112A of the protection device 110A is shorter than the length LT11 of the first section 1121 of the protection device 110, and the length LT22 of the second section 1122 of the first conductive member 112A of the protection device 110A is also shorter than the length LT21 of the second section 1122 of the protection device 110.

Similarly, as shown in FIG. 2 and FIG. 6, the length LT13 of the first section 1121 of the first conductive member 112B of the protection device 110B is shorter than the length LT11 of the first section 1121 of the protection device 110, and the length LT23 of the second section 1122 of the first conductive member 112B of the protection device 110B is also shorter than the length LT21 of the second section 1122 of the protection device 110.

Furthermore, the length LT23 of the second section 1122 of the protection device 110B is also shorter than the length LT22 of the second section 1122 of the protection device 110A. Furthermore, the size of the second conductive member 114 of the protection device 110B is greater than the size of the second conductive member 114 of the protection device 110A, so as to increase the contact area, so that the electrostatic charges can be conducted to the base 102 more effectively.

It is worth noting that because the first conductive member 112 is flexible, the protection device 110 can also be applied to a 14-inch notebook computer. As long as the second section 1122 is folded to reduce its length, then it can be installed on a 14-inch notebook computer. That is to say, electronic devices of different sizes can use a single size protection device, thus further reducing the production costs.

Figure 7:
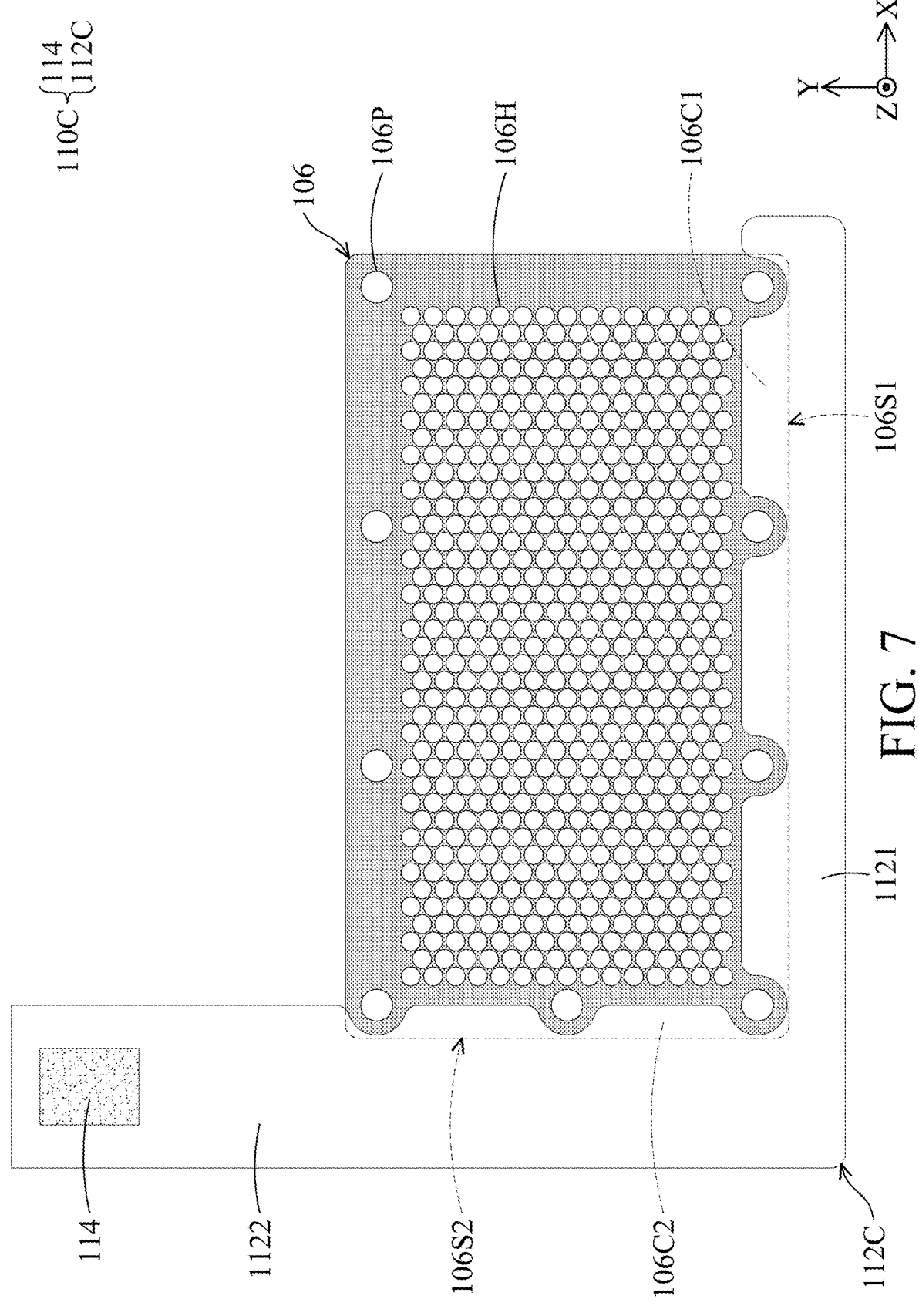
FIG. 7 is a top view of the protection device 110C and the metal member 106 according to another embodiment of the present disclosure.

Next, please refer to FIG. 7, which is a top view of the protection device 110C and the metal member 106 according to another embodiment of the present disclosure. In this embodiment, the metal member 106 has a rectangular structure, and the first section 1121 and the second section 1122 of the first conductive member 112C are respectively in contact with the first side 106S1 and the second side 106S2 of the rectangular structure.

Similarly, a first contact portion 106C1 and a second contact portion 106C2 are respectively provided on the first side 106S1 and the second side 106S2, and no insulation layer is provided on the first contact portion 106C1 and the second contact portion 106C2. The first contact portion 106C1 and the second contact portion 106C2 are configured to respectively contact the first section 1121 and the second section 1122. Based on such a structural configuration, the contact area between the protection device 110C and the metal member 106 can be increased, thereby increasing the efficiency of removing the electrostatic charges.

Figure 8:
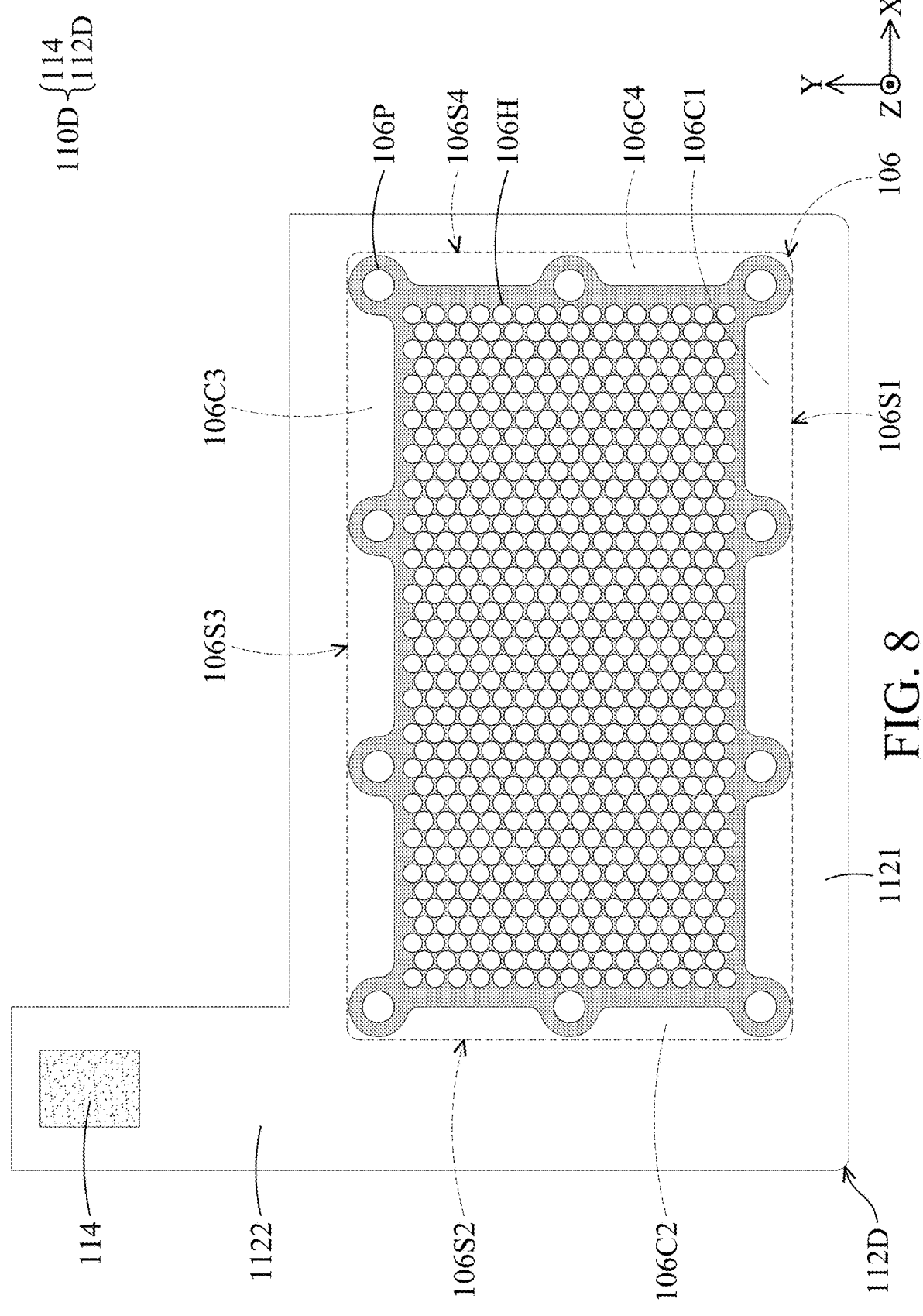
FIG. 8 is a top view of the protection device 110D and the metal member 106 according to another embodiment of the present disclosure.

Please refer to FIG. 8, which is a top view of the protection device 110D and the metal member 106 according to another embodiment of the present disclosure. In this embodiment, the metal member 106 has a rectangular structure. The first section 1121 and the second section 1122 of the first conductive member 112D can form a frame-shaped structure, corresponding to the rectangular structure, and the frame-shaped structure is in contact with four sides of the rectangular structure.

As shown in FIG. 8, the first section 1121 is in contact with the first contact portion 106C1, the third contact portion 106C3 and the fourth contact portion 106C4 respectively on the first side 106S1, the third side 106S3 and the fourth side 106S4, and the second section 1122 is in contact with the second contact portion 106C2 on the second side 106S2.

Similarly, no insulation layer is provided on the first contact portion 106C1, the second contact portion 106C2, the third contact portion 106C3, and the fourth contact portion 106C4. Based on such a structural configuration, the contact area between the protection device 110D and the metal member 106 can be further increased, thereby increasing the efficiency of removing the electrostatic charges.

In summary, the present disclosure provides an electronic device, which includes a base, a covering body, a metal member and a protection device. The covering body has conductive material and is fixedly connected to the base. The metal member is fixedly disposed on base. The protection device is disposed on the base and connected between the metal member and the covering body. The covering body and the base are arranged along the first axis, and the protection device overlaps at least a portion of the metal member when viewed along the first axis.

The protection device may include a first conductive member and a second conductive member. The second conductive member is fixedly disposed on the first conductive member. The first conductive member is configured to contact a part of the metal member, and the second conductive member is configured to contact a part of the covering body. Based on this configuration, when electrostatic charges are generated on the metal member, the electrostatic charges can be conducted to the first section of the first conductive member through the contact portion of the metal member, and then conducted through the second section of the first conductive member and the second conductive member in sequence to the grounding terminal on the covering body. Therefore, the protection device can effectively conduct the electrostatic charges to the ground to protect the electronic components in the electronic device from being damaged by the electrostatic charges.

In some embodiments, the first conductive member has an L-shaped structure, but it is not limited thereto. In other embodiments, the first conductive member may have a frame-shaped structure. In addition, the first conductive member is flexible, thus increasing the convenience of being installed on the base. In addition, because it can be bent or folded, electronic devices of different sizes can use a single size protection device, thus further reducing the production costs.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein can be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An electronic device, comprising:
a base;
a covering body, made of conductive material and fixedly connected to the base;
a metal member, fixedly disposed on the base; and
a protection device, disposed on the base and connected between the metal member and the covering body,
wherein the covering body and the base are arranged along a first axis, and when viewed along the first axis, the protection device overlaps at least a portion of the metal member;
wherein the protection device comprises a first conductive member and a second conductive member, the second conductive member is disposed on the first conductive member, the first conductive member is configured to be in contact with a portion of the metal member, and the second conductive member is configured to be in contact with a portion of the covering body;
wherein the first conductive member has a first section and a second section, the second section is connected to the first section, the first section extends along a second axis, the second section extends along a third axis, and the first axis, the second axis and the third axis are perpendicular to each other;
wherein the metal member has at least one opening, the base is made of a plastic material, and a portion of the base corresponding to the at least one opening is processed by hot melting so as to affix the metal member to the base.

2. The electronic device as claimed in claim 1, wherein the first section has at least one notch, corresponding to the at least one opening.

3. The electronic device as claimed in claim 2, wherein an insulation layer is formed on a surface of the metal member, and the metal member further has a contact portion configured to contact the first section of the first conductive member.

4. The electronic device as claimed in claim 3, wherein there is no insulation layer provided on the contact portion.

5. The electronic device as claimed in claim 4, wherein the metal member has a rectangular structure, and the first section is in contact with a first side of the rectangular structure.

6. The electronic device as claimed in claim 4, wherein the metal member has a rectangular structure, and the first section and the second section are respectively in contact with a first side and a second side of the rectangular structure.

7. The electronic device as claimed in claim 4, wherein a length of the second section is 4 to 8 cm, and a distance between the second conductive member and the metal member along the third axis is 5 to 7 cm.

8. The electronic device as claimed in claim 4, wherein the second section has a perforation, and a positioning column is disposed on the base, and when the protection device is affixed to the base, the positioning column passes through the perforation.

9. The electronic device as claimed in claim 8, wherein the positioning column is made of a plastic material.

10. The electronic device as claimed in claim 1, wherein the metal member has a rectangular structure, the first conductive member has a frame-shaped structure corresponding to the rectangular structure, and the frame-shaped structure is in contact with four sides of the rectangular structure.

11. The electronic device as claimed in claim 1, wherein the electronic device further includes a motherboard, and when viewed along the first axis, the protection device does not overlap the motherboard.

12. The electronic device as claimed in claim 1, wherein a plurality of air vents are formed on the base, and a plurality of perforations are formed on the metal member corresponding to the air vents, so that heat generated by the electronic device is dissipated to an external environment through the perforations and the air vents.

13. The electronic device as claimed in claim 1, wherein the second conductive member is disposed on the first conductive member, wherein the first conductive member is flexible, and the first conductive member is made of a metal material.

14. The electronic device as claimed in claim 13, wherein the first conductive member is a conductive cloth, and the second conductive member is a gasket.

* * * * *